(12) United States Patent
Korsunsky et al.

(10) Patent No.: US 7,044,748 B2
(45) Date of Patent: May 16, 2006

(54) ELECTRICAL DEVICE FOR INTERCONNECTING TWO PRINTED CIRCUIT BOARDS AT A LARGE DISTANCE

(75) Inventors: Iosif R. Korsunsky, Harrisburg, PA (US); Wei-Chen Lee, Harrisburg, PA (US)

(73) Assignee: Hon Hai Precision Ind. Co., LTD, Tapei Hsien (TW)

( * ) Notice: Subject to any disclaimer, the term of this patent is extended or adjusted under 35 U.S.C. 154(b) by 0 days.

(21) Appl. No.: 10/672,084

(22) Filed: Sep. 26, 2003

(65) Prior Publication Data

US 2005/0070136 A1    Mar. 31, 2005

(51) Int. Cl.
*H01R 9/09*    (2006.01)
(52) U.S. Cl. ......................................... 439/74; 439/631
(58) Field of Classification Search .................. 439/65, 439/74 L, 76.1, 631, 637, 945
See application file for complete search history.

(56) References Cited

U.S. PATENT DOCUMENTS

| | | | |
|---|---|---|---|
| 5,556,286 A * | 9/1996 | Ikesugi et al. ................. 439/74 |
| 5,800,186 A * | 9/1998 | Ramirez et al. .............. 439/74 |
| 6,116,957 A | 9/2000 | Mickievicz et al. |
| 6,341,966 B1 * | 1/2002 | Takada et al. .............. 439/108 |
| 6,447,310 B1 | 9/2002 | Brown |
| 6,477,059 B1 * | 11/2002 | Ono et al. ................... 361/785 |
| 6,497,579 B1 * | 12/2002 | Garbini ........................ 439/63 |
| 6,561,821 B1 * | 5/2003 | Yu ............................... 439/74 |

* cited by examiner

*Primary Examiner*—Thanh-Tam Le
(74) *Attorney, Agent, or Firm*—Wei Te Chung

(57) ABSTRACT

An electrical device 1 for interconnecting two printed circuit boards 2, 3 (PCBs) at a large distance includes a first connector 4 and a second connector 5 for being respectively mounted on the two PCBs, and an extender 6 located between and electrically connected with the first and second connectors. The extender includes a frame 7 for being fixed to one PCB, and two circuit boards 8, 9 attached to the frame and connecting with the first and second connectors at opposite ends thereof.

15 Claims, 9 Drawing Sheets

US 7,044,748 B2

ELECTRICAL DEVICE FOR INTERCONNECTING TWO PRINTED CIRCUIT BOARDS AT A LARGE DISTANCE

CROSS REFERENCE TO RELATED APPLICATIONS

This patent application relates to an earlier filed co-pending U.S. patent application Ser. No. 10/159,459, entitled "ELECTRICAL SYSTEM HAVING MEANS FOR ACCOMMODATING VARIOUS DISTANCES BETWEEN PC BOARDS THEREOF MOUNTING THE MEANS", filed on May 31, 2002 and assigned to the same assignee as the present invention.

BACKGROUND OF THE INVENTION

1. Field of the Invention

The present invention relates to an electrical device for interconnecting two printed circuit boards (PCBs), and particularly to an electrical device for interconnecting two parallel PCBs at a large distance.

2. Description of Related Art

Board mountable connectors are widely used to establish electrical connections between two separated PCBs. Usually, there are two connectors, a plug connector and a receptacle connector, respectively mounted onto the PCBs and engagable with each other. However, the conventional method using plug and receptacle connectors has been limited. In some situations, PCBs may be positioned within an electrical system at a large distance, where the plug and receptacle connectors have to span the large distance and thus would be fairly tall. A tall connector has greater tolerances associated with it and may undesirably expand and contract greatly over temperature variations. This may possibly cause unreliable electrical coupling between two PCBs. Furthermore, the large distance between the PCBs would also require the plug and receptacle connectors to be fairly high and therefore expensive and difficult to manufacture.

One solution to the above issue is to provide two identical board mountable connectors respectively mounted on the two PCBs, and an extender engagable with the board mountable connectors. The extender includes an insulative housing, being generally "H"-shaped, and a plurality of conductive contacts received in passageways defined in the housing. When an extender is needed for a high stack height application, the contacts are usually long. This results in difficulties of inserting the contacts into the passageways of the housing without damage.

Another solution to the above issue is to provide an expensive cable assembly with two connectors at opposite ends to respectively connect with two PCBs. However, with electronic signal speeds currently in the gigahertz range and still increasing, deleterious transmission line effects have become more prevalent. The electrical connection of two PCBs by way of wire cables and connectors, often results in relatively long transmission lines between the two boards, allowing unwanted signal loss to exist. To mitigate these effects, shorter transmission lines between the two PCBs are advantageous.

Accordingly, there is a need for providing an effective and economical solution for the requirement of a high stack height application. To that end, the use of some kind of cost-effective PCB interconnection device, which ensures reliable electrical connection between two PCBs and provides an easy assembly, is desirable.

SUMMARY OF THE INVENTION

Accordingly, one object of the present invention is to provide a cost-effective, easily-assembled electrical device for interconnecting two PCBs at a large distance.

Another object of the present invention is to provide an electrical device reliably interconnecting two PCBs by reducing signal line lengths between the two PCBs.

A further object of the present invention is to provide an extender having a circuit board for facilitating assembly of the extender.

In order to achieve the objects set forth, an electrical device for interconnecting two PCBs at a large distance in accordance with the present invention comprises a first and a second connectors for being respectively mounted on the two PCBs, and an extender located between and electrically connected with the first and second connectors. The extender comprises a frame for being fixed to one PCB, and two circuit boards attached to the frame and connecting with the first and second connectors at opposite ends thereof. Each circuit board has signal and ground traces on opposite sides thereof to connect with corresponding signal and ground contacts of the first and second connectors.

Other objects, advantages and novel features of the invention will become more apparent from the following detailed description when taken in conjunction with the accompanying drawings.

DETAILED DESCRIPTION OF THE INVENTION

Figure 1:
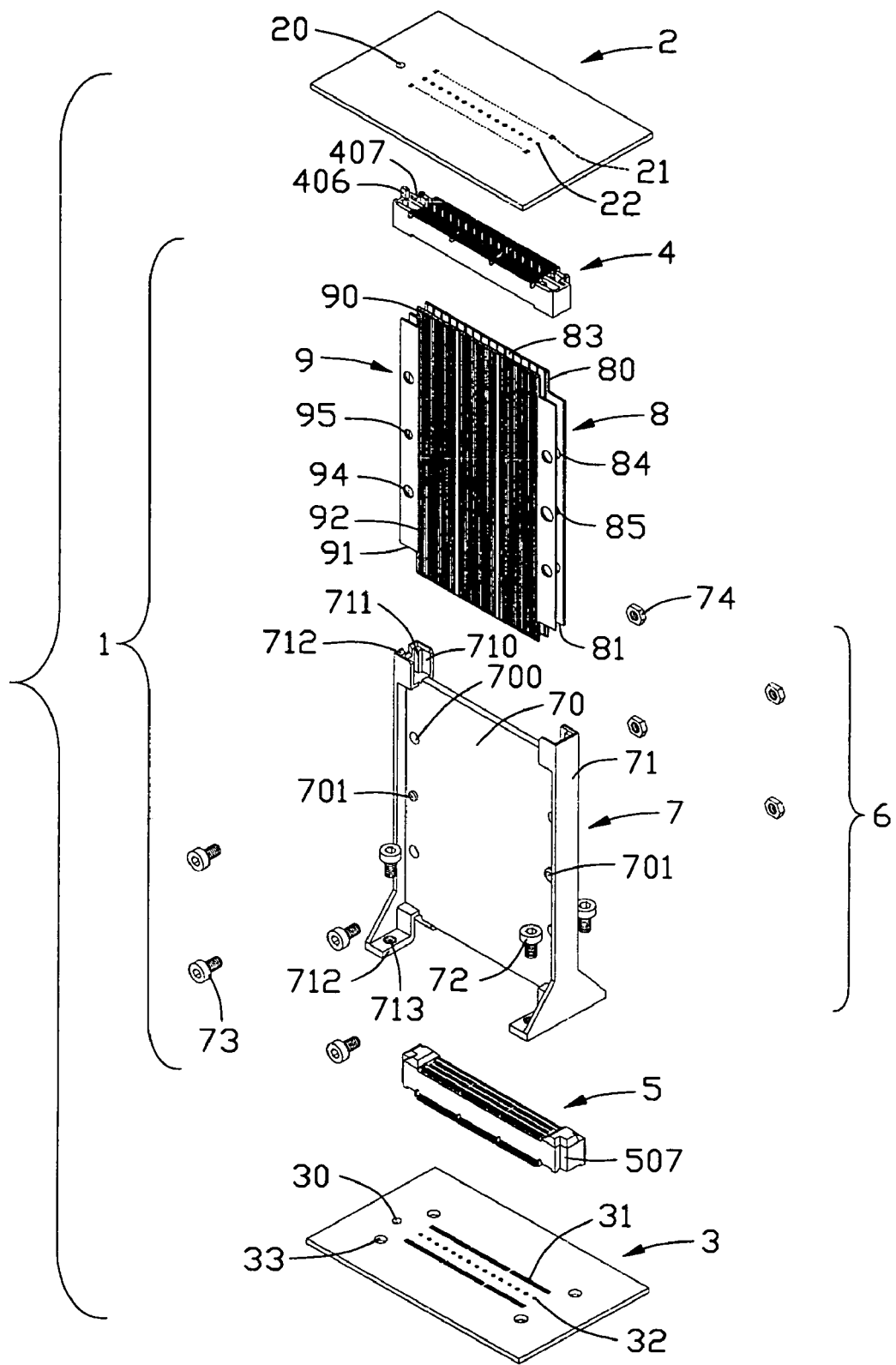
FIG. 1 is an exploded, perspective view of an electrical device in accordance with the present invention and two PCBs to be connected thereto.

Reference will now be made to the drawing figures to describe the present invention in detail.

Figure 2:
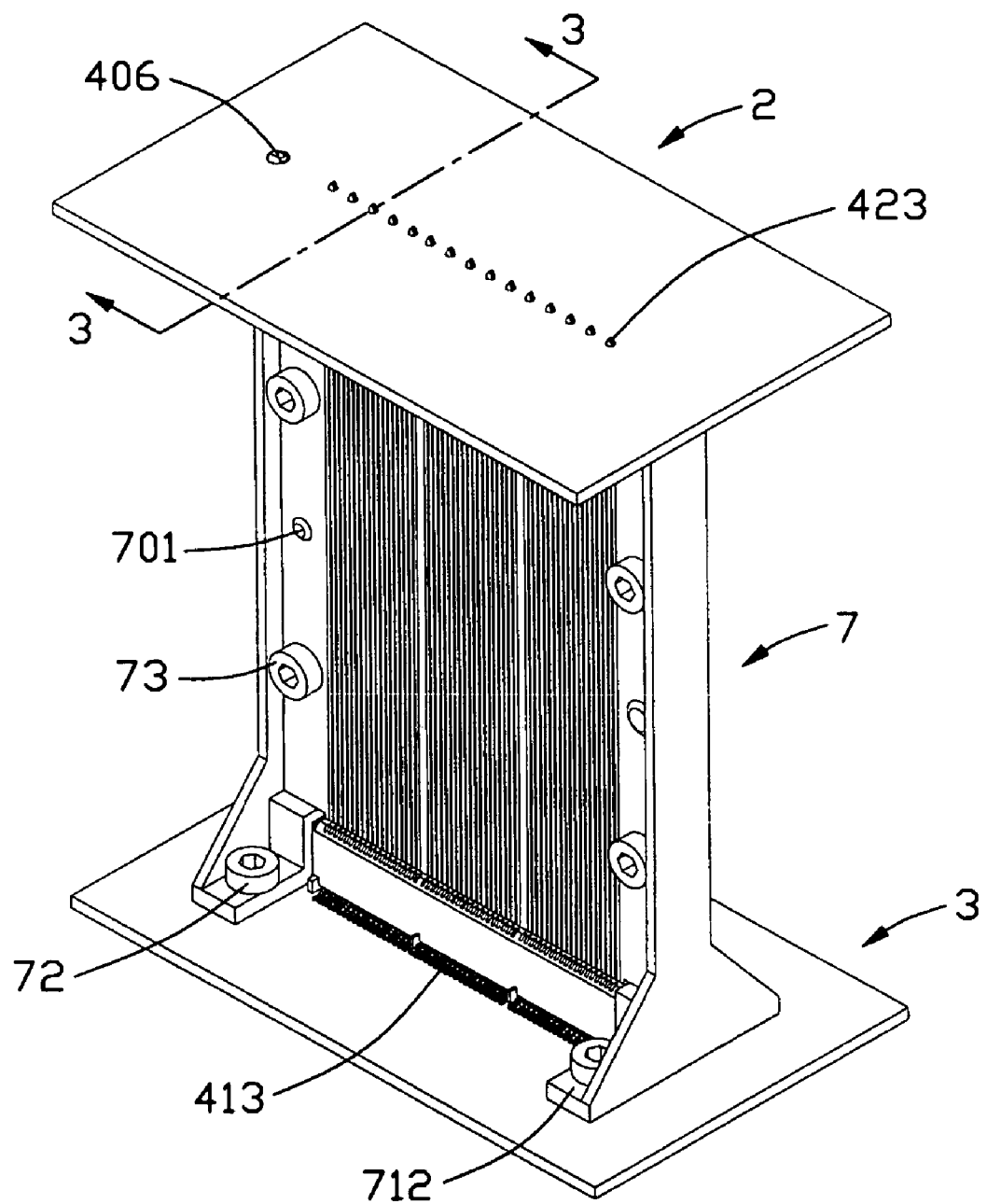
FIG. 2 is an assembled view of FIG. 1.
Figure 3:
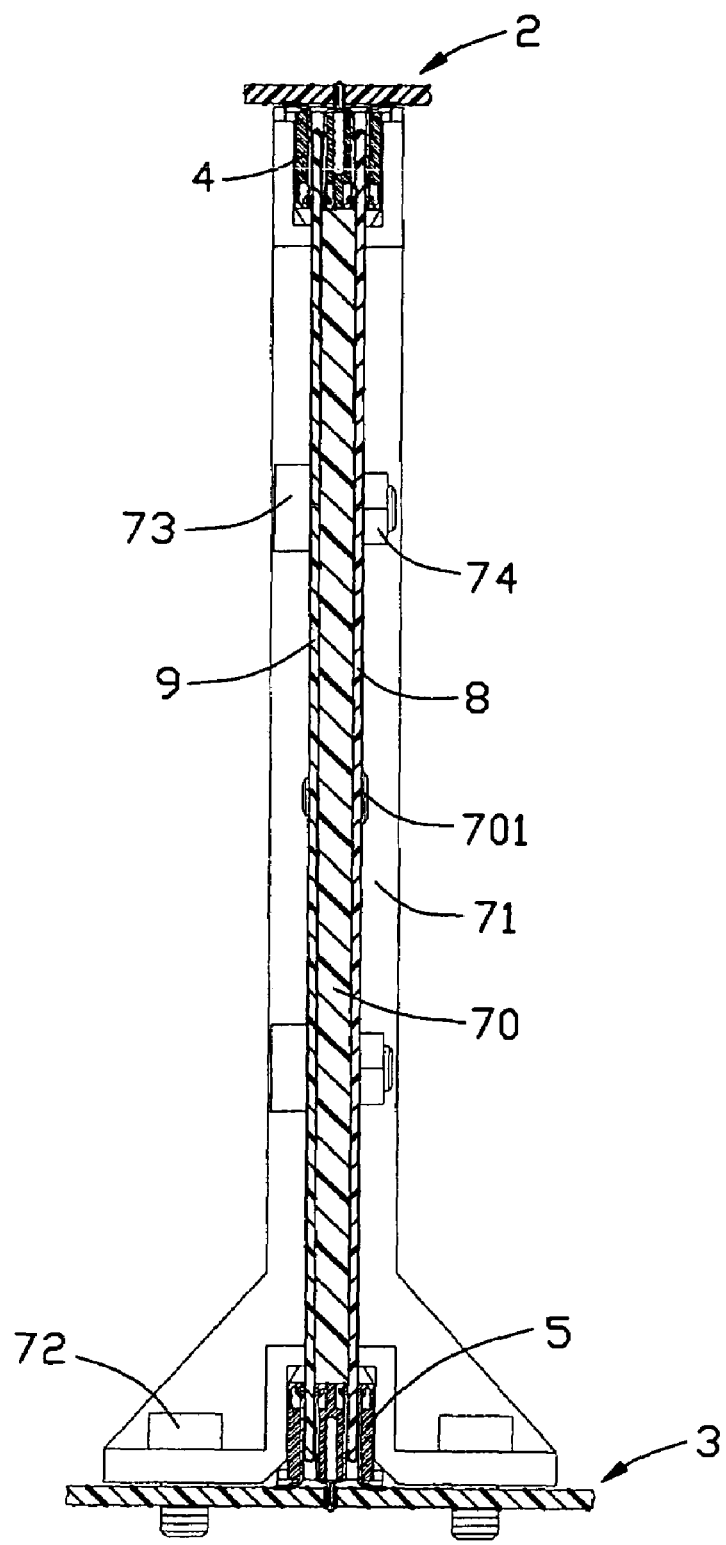
FIG. 3 is a cross-sectional view taken along line 3—3 of FIG. 2.

Referring to FIGS. 1–3, an electrical device 1 for interconnecting two PCBs 2, 3 at a large distance in accordance with the present invention comprises a first and a second connectors 4, 5 for being respectively mounted on the two PCBs 2, 3, and an extender 6 located between and interconnected with the first and second connectors 4, 5. The extender 6 comprises a frame 7 for being fixed to the PCB 3, and two circuit boards 8, 9 attached to the frame 7 and connecting with the first and second connectors 4, 5 at opposite ends thereof.

Figure 4:
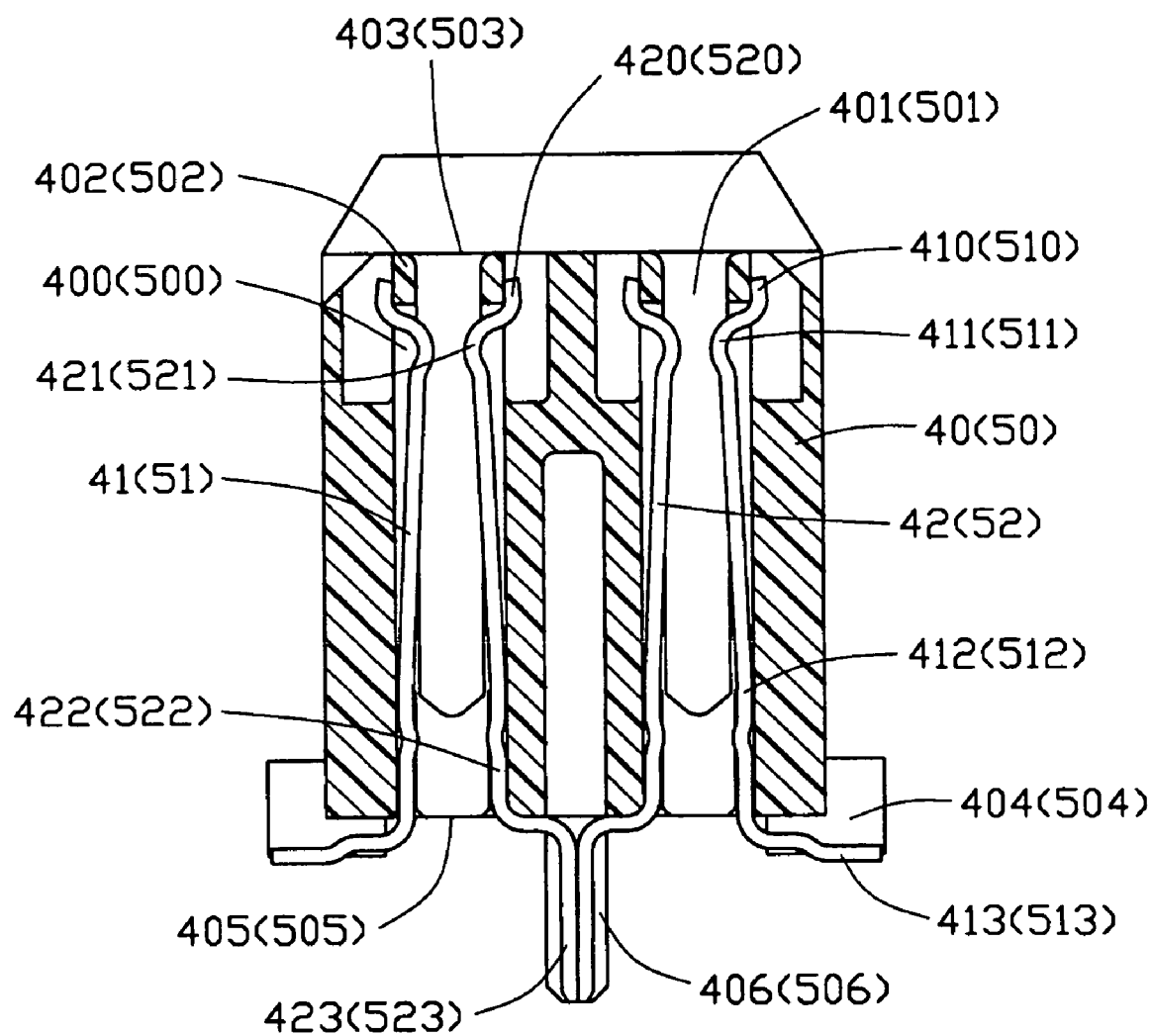
FIG. 4 is a cross-sectional view of either connector shown in FIG. 1.
Figure 5:
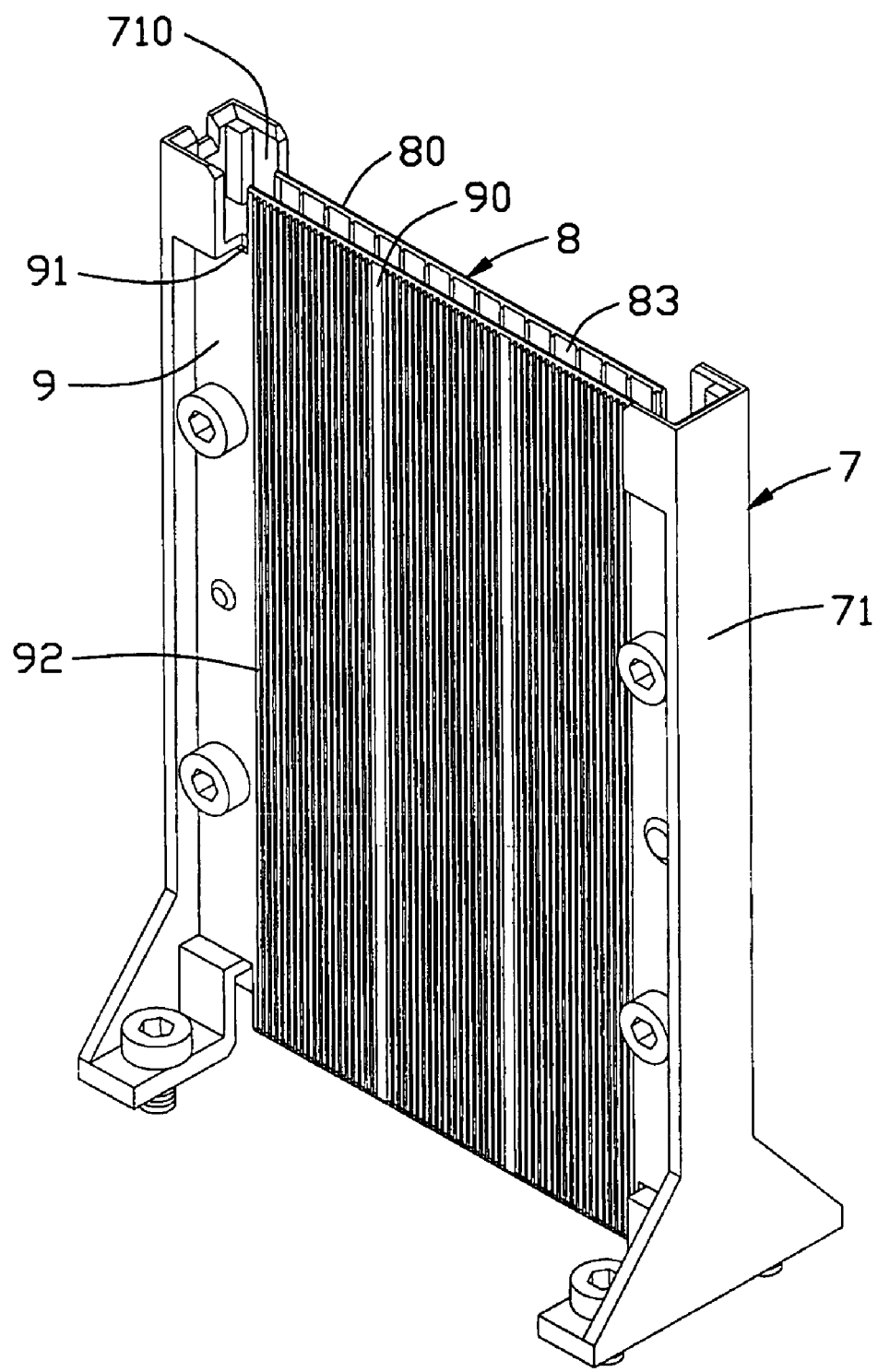
FIG. 5 is a perspective view of an extender of the electrical device of the present invention.
Figure 6:
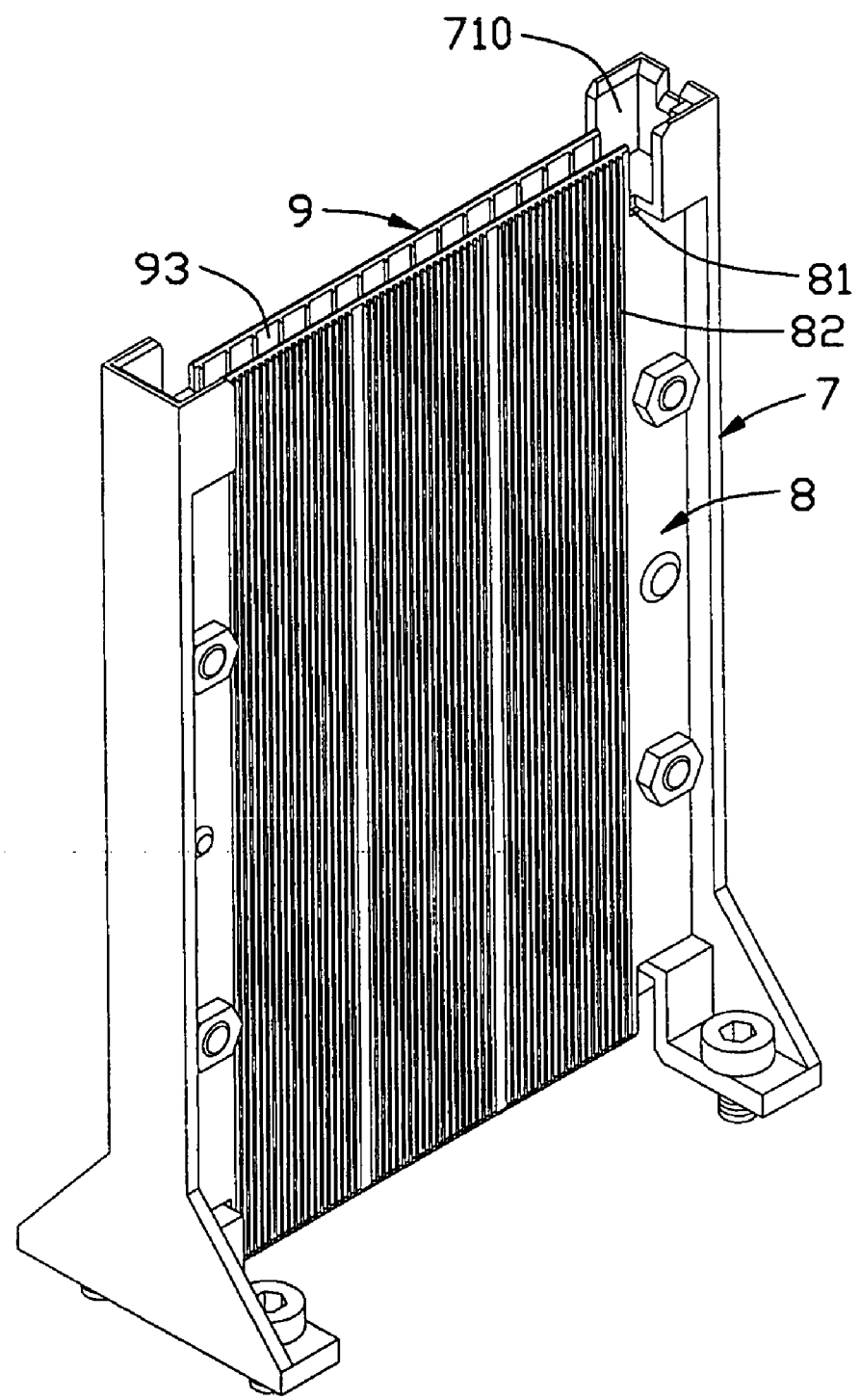
FIG. 6 is a view similar to FIG. 4, but showing an opposite of the extender.
Figure 7:
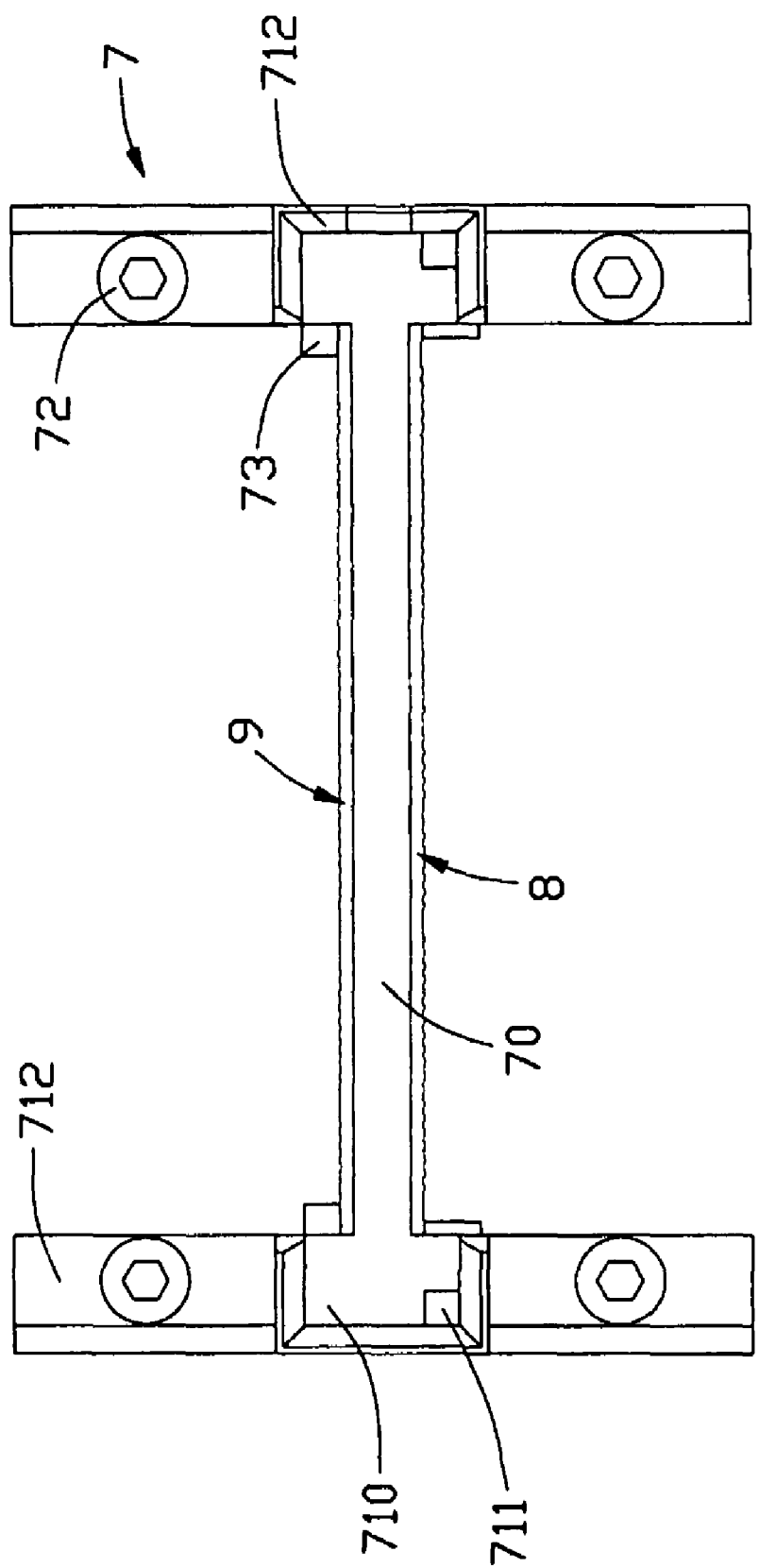
FIG. 7 is a top, planar view of the extender.
Figure 8:
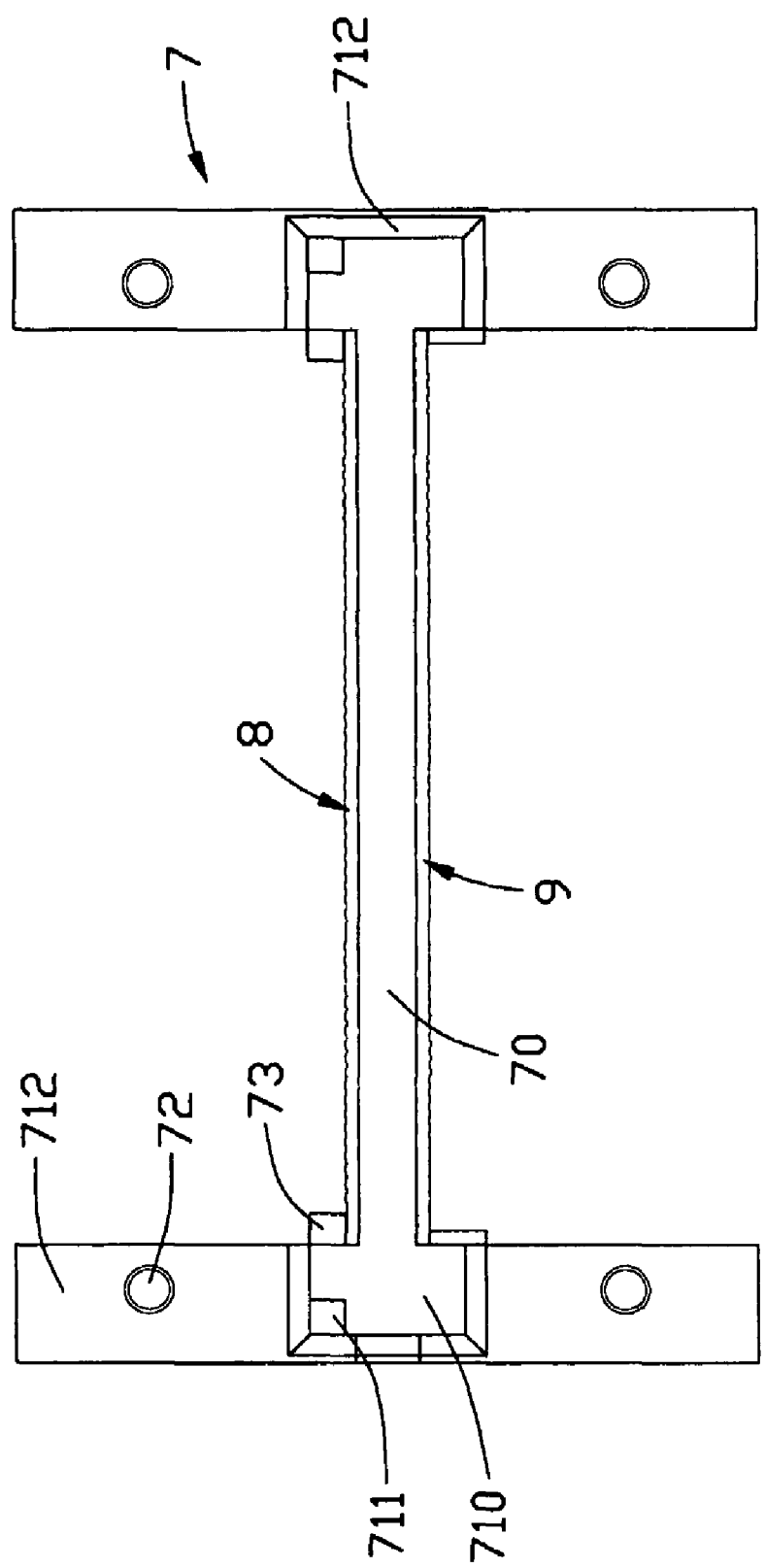
FIG. 8 is a bottom, planar view of the extender.
Figure 9:
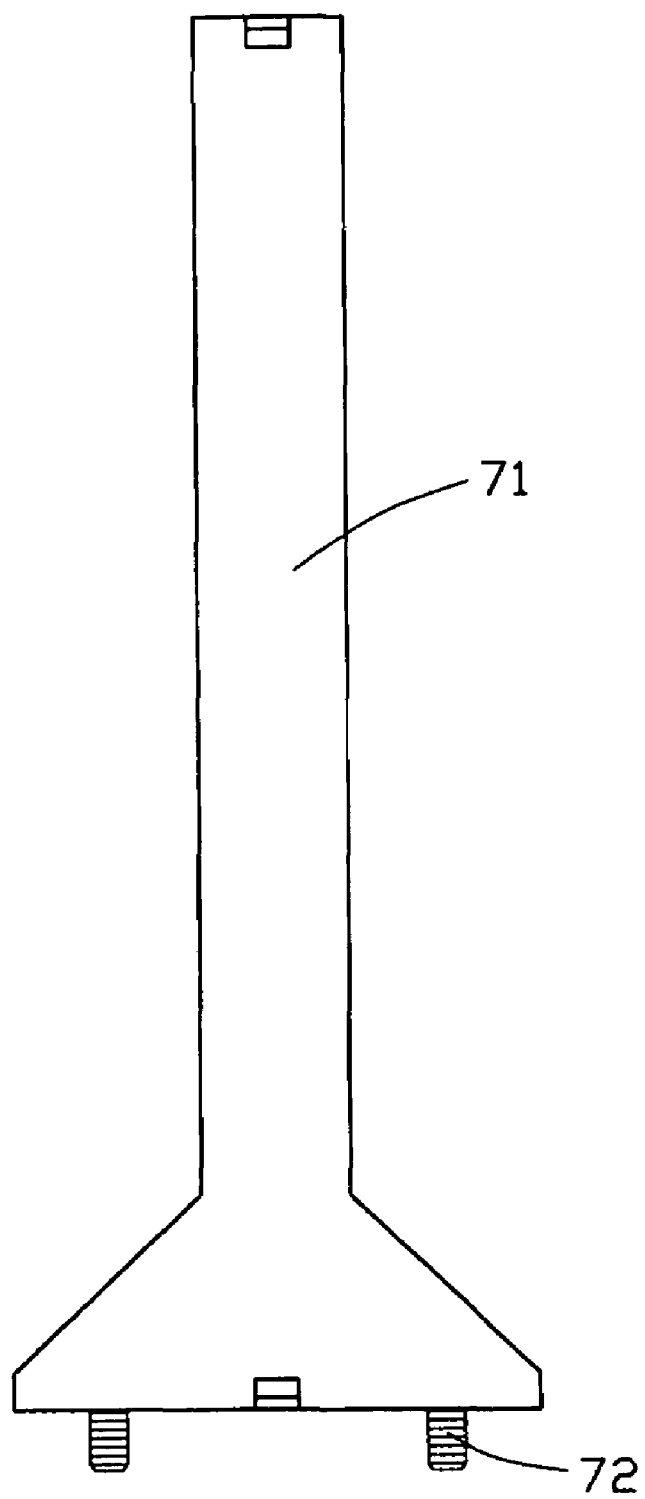
FIG. 9 is a side view of the extender.

The first and second connectors 4, 5 are preferably identical in this invention. Also referring to FIG. 4, each connector 4 (5) includes an insulative housing 40 (50), a plurality of signal contacts 41 (51) and a plurality of ground contacts 42 (52). The insulative housing 40 (50) defines a plurality of passageways 400 (500) aligned in four rows in a longitudinal direction thereof, and two longitudinal slots 401 (501) each communicating with two corresponding rows of the passageways 400 (500). Two rows of retaining ribs 402 (502) are respectively provided on opposite sides of each slot 401 (501) proximate to a mating surface 403 (503) of the insulative housing 40 (50). Each retaining rib 402 (502) bears against a tip of a corresponding signal contact 41 (51) or ground contact 42 (52) for preloading purposes. The insulative housing 40 (50) further provides a plurality of stand-offs 404 (504) adjacent to a board mounting surface 405 (505) thereof and a polarization peg 406 (506) at one end thereof for being inserted into a corresponding through hole 20 (30) of the PCB 2 (3). A pair of grooves 407 (507) is defined at opposite ends of the insulative housing 40 (50) for polarization purposes.

The signal contacts 41 (51) are received in two outer rows of the passageways 400 (500), and the ground contacts 42 (52) are received in two inner rows of the passageways 400 (500). Each signal contact 41 (51) includes a contact portion 411 (511) connecting with the tip 410 (510) and projecting into a corresponding slot 401 (501), a retention portion 412 (512), and a surface mount portion 413 (513) extending beyond the board mounting surface 405 (505) of the insulative housing 40 (50) for being soldered to a corresponding solder pad 21 (31) of the PCB 2 (3). Each ground contact 42 (52) similarly includes a contact portion 421 (521) connecting with the tip 420 (520) and projecting into a corresponding slot 401 (501), a retention portion 422 (522), and a tail portion 423 (523) extending beyond the board mounting surface 405 (505) of the insulative housing 40 (50). The tail portions 423 (523) of the two rows of ground contacts 42 (52) in a same cross-section of the housing 40 (50) abut against each other for being inserted into a same plated through hole 22 (32) of the PCB 2 (3).

The detailed structure of the extender 6 is shown in FIGS. 1 and 5–9. The frame 7 of the extender 6 has a body portion 70 and two side portions 71. The body portion 70 provides a plurality of through holes 700 and two locating pegs 701 each having opposite end portions of different size. Each side portion 71 of the frame 7 has two substantially identical receiving sections 710 at opposite ends thereof. The pair of receiving sections 710 at the same end of the frame 7 is arranged in such a manner that a receiving port is defined therebetween for receiving a corresponding connector 4, 5 therein. A lead-in 712 is provided at the top of each receiving section 710 for guiding insertion of a corresponding connector 4, 5 into the receiving port. A protrusion 711 is provided in each receiving section 710 for engagement with a corresponding groove 407, 507 of the connector 4, 5. A pair of mounting legs 712 is provided at opposite sides of one receiving section 710 of each side portion 71. Each mounting leg 712 defines a hole 713 therein for allowing extension of a screw 72 therethrough into a corresponding hole 33 of the PCB 3, thereby securing the frame 7 to the PCB 3.

Each circuit board 8, 9 has a pair of end portions 80, 90 at opposite ends thereof and a pair of shoulders 81, 91 on opposite sides of each end portion 80, 90. A plurality of signal traces 82, 92 and ground traces 83, 93 is respectively provided on opposite sides of each circuit board 8, 9 to connect with corresponding signal contacts 41, 51 and ground contacts 42, 52 of the first and second connectors 4, 5. Each circuit board 8, 9 further defines a plurality of first holes 84, 94 aligned with corresponding through holes 700 of the frame 7 for extension of a corresponding number of bolts 73 therethrough to engage with a corresponding number of bolts 74. Two second holes 85, 95 of different size are further defined in each circuit board 8, 9 for receiving corresponding end portions of the two locating pegs 701 of the frame 7. The two circuit boards 8, 9 are securely attached to the body portion 70 of the frame 7 by means of the bolt-nut engagement and also by the engagement between the locating pegs 701 and the second holes 701. After attachment, the signal traces 82, 92 of the two circuit boards 8, 9 are outwardly exposed, the shoulders 81, 91 abut against the bottoms of corresponding receiving sections 710 of the frame 7, and the end portions 80, 90 extend into corresponding receiving ports of the frame 7 for allowing mating of the respective signal traces 82, 92 and ground traces 83, 93 thereon with corresponding signal contacts 41, 51 and ground contacts 42, 52 of the first and second connectors 4, 5.

The electrical device 1 of the present invention provides an effective and economical solution for the requirement of a high stack height application. By providing an extender configured by a frame and two circuit boards, the assembly of the electrical device is significantly facilitated. The provision of the circuit board 8, 9 instead of a conventional cable assembly ensures a reliable electrical interconnection between the two PCBs 2, 3 since signal line lengths between the two PCBs 2, 3 are reduced and thus deleterious transmission line effects are eliminated. To further ensure a reliable electrical interconnection between the two PCBs 2, 3, a metal shield may be attached to the electrical device 1 of the present invention to reduce electromagnetic interference.

It should be understood that, although two circuit boards 8, 9 are employed in the preferred embodiment of this invention, one circuit board instead of two may also be applied to achieve the same inventive objects. In such a situation, the connectors 4, 5 should be modified to include only two rows of contacts instead of four.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An extender for use between two connectors, comprising:
   a frame having a body portion and two receiving ports at opposite ends thereof adapted for respectively receiving said two connectors, the frame comprising two side portions on opposite sides of the body portion, each side portion having two receiving sections at opposite ends thereof, the pair of receiving sections at the same end of the frame defining said receiving port, each receiving section having a pair of mounting legs provided at opposite sides thereof for being mounted on a printed circuit board; and
   a circuit board attached to the body portion of the frame, the circuit board having conductive traces disposed along at least one side thereof and opposite end portions respectively extending into the two receiving ports of the frame.

2. The extender as described in claim 1, wherein the two receiving ports of the frame are substantially identical.

3. The extender as described in claim 1, wherein the circuit board comprises a pair of shoulders on opposite sides of each end portion, each shoulder abutting against the bottom of a corresponding receiving section of the frame.

4. The extender as described in claim 1, wherein a protrusion is provided in each receiving section of the frame adapted for engagement with a corresponding groove of said connector.

5. The extender as described in claim 1, wherein the conductive traces of the circuit board include a plurality of signal traces and ground traces respectively disposed on opposite sides of the circuit board.

6. The extender as described in claim 5, further comprising a second circuit board identical to said circuit board, said circuit board and said second circuit board being respectively attached to opposite sides of the body portion of the frame.

7. The extender as described in claim 6, wherein said circuit board and said second circuit board are respectively attached to opposite sides of the body portion of the frame in such a manner that the signal traces thereof are outwardly exposed.

8. An electrical device for electrically interconnecting two printed circuit boards (PCB), comprising:
a first and a second connectors adapted for being respectively mounted on said two PCBs, the first and second connectors having respective first and second contacts received therein, the first and second contacts having plurality of signal contacts arranged in two outer rows and a plurality of grounding contacts arranged in two inner rows, the ground contacts having tail portions in a same cross-section of said connector abutting against each other; and
an extender located between the first and second connectors, the extender comprising a frame, a circuit board and a second circuit board identical to said circuit board, the circuit board and the second circuit board respectively attached to opposite sides of the frame, the frame defining two receiving ports at opposite ends thereof for respectively receiving the first and second connectors therein, the circuit board having conductive traces disposed along at least one side thereof and opposite end portions respectively extending into the two receiving ports of the frame, the conductive traces comprising a plurality of signal traces and ground traces respectively disposed on opposite sides of the circuit board, whereby upon the insertion of the first and second connectors into corresponding receiving ports of the frame, the conductive traces of the circuit board electrically connect with corresponding first and second contacts of the first and second connectors at opposite ends thereof.

9. The electrical device as described in claim 8, wherein the first and second connectors are identical.

10. The electrical device as described in claim 9, wherein the frame of the extender includes a body portion an a pair of side portions, each side portions having two substantially identical receiving sections at opposite ends thereof, the pair of receiving sections at the same end of the frame defining said receiving port.

11. The electrical device as described in claim 10, wherein the circuit board comprises a pair of shoulders on opposite sides of each end portion, each shoulder abutting against the bottom of a corresponding receiving section of the frame.

12. The electrical device as described in claim 8, wherein a protrusion is provided in each receiving port of the frame, and each connector defines a groove for engagement with a corresponding protrusion.

13. An electrical system comprising:
a first printed circuit board (PCB);
a second PCB parallel to the first PCB;
a first connector mounted on the first PCB, the first connector having a first slot and a plurality of first contacts disposed proximate to the firs slot;
a second connector mounted on the second PCB, the second connector having a second slot and a plurality of second contacts disposed proximate to the second slot; and
an extender located between the first and second connectors, the extender comprising a frame and a circuit board attached to the frame, the frame defining two receiving ports at opposite ends thereof for respectively receiving the first and second connectors therein, the circuit board having opposite end portions respectively extending into the first and second slots of the first and second connectors to allow conductive traces disposed thereon to electrically connect with corresponding first and second contacts of the first and second connectors.

14. The system as described in claim 13, wherein at least one end of said extender is attached to one of said first and second PCBs.

15. An electrical connection system comprising:
an insulative housing defining two parallel slots along a longitudinal direction thereof;
two rows of passageways located by two sides of each of said slots;
inner and outer rows of contacts disposed in the corresponding passageways, respectively, by two sides of each of said slots;
the contacts disposed in one inner row and those corresponding ones in another inner row being mechanically and electrically engaged with each other in a transverse direction perpendicular to said longitudinal direction;
two spaced circuit boards respectively downwardly inserted into the corresponding slots and electrically and mechanically engaged with the corresponding contacts; wherein
each of said circuit boards includes an outer face outwardly exposed to an exterior in said transverse direction, and an inner face supportably abutting against a body portion of a frame, said body portion being sandwiched between said two circuit boards; wherein
said frame is fastened to another printed circuit board on which the housing is mounted.

* * * * *